(12) United States Patent
Ootake

(10) Patent No.: US 8,293,565 B2
(45) Date of Patent: Oct. 23, 2012

(54) MANUFACTURING METHOD FOR SOLID-STATE IMAGING DEVICE

(75) Inventor: Hajime Ootake, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/050,530

(22) Filed: Mar. 17, 2011

(65) Prior Publication Data

US 2012/0003778 A1 Jan. 5, 2012

(30) Foreign Application Priority Data

Jun. 30, 2010 (JP) ................................. 2010-149618

(51) Int. Cl.
*H01L 21/00* (2006.01)

(52) U.S. Cl. ....... 438/73; 250/208.1; 250/216; 250/226; 257/E31.127; 257/432; 257/440; 349/620; 349/640; 438/69; 438/70

(58) Field of Classification Search ............... 250/208.1, 250/216, 226; 257/E31.127, 432, 440; 349/620, 349/642; 438/69, 70, 73
See application file for complete search history.

(56) References Cited

U.S. PATENT DOCUMENTS

| 2008/0157137 A1* | 7/2008 | Cho ............................. 257/292 |
| 2009/0181501 A1* | 7/2009 | Sekine et al. ................. 438/144 |
| 2009/0200623 A1* | 8/2009 | Qian et al. ................... 257/432 |
| 2011/0018080 A1 | 1/2011 | Ootake |

FOREIGN PATENT DOCUMENTS

| JP | 2008-153331 | 7/2008 |
| WO | WO 2006/060298 A2 | 6/2006 |

OTHER PUBLICATIONS

Park, "When top-down meets bottom-up: EUV and X-ray interference lithography for sub—20—nm features", Nanowerk, posted Jul. 8, 2010 in http://www.nanowerk.com.*
U.S. Appl. No. 13/225,907, filed Sep. 6, 2011, Ootake.

* cited by examiner

*Primary Examiner* — Asok Sarkar
(74) *Attorney, Agent, or Firm* — Oblon, Spivak, McClelland, Maier & Neustadt, L.L.P.

(57) ABSTRACT

A manufacturing method for a solid-state imaging device according to an embodiment of the present invention includes a step of forming a transparent resin layer above a principal surface of a semiconductor substrate, a step of exposing the transparent resin layer to light by using a grating mask having a first transmission region and a second transmission region having a higher transmittance of the light than the first transmission region in mutually separate positions, a step of forming first resin patterns and second resin patterns lower than the first resin patterns in mutually separate positions, and a step of forming first microlenses and second microlenses lower than the first microlenses.

19 Claims, 11 Drawing Sheets

MANUFACTURING METHOD FOR SOLID-STATE IMAGING DEVICE

CROSS REFERENCE TO RELATED APPLICATIONS

This application is based upon and claims the benefit of priority from the prior Japanese Patent Application No. 2010-149618 filed in Japan on Jun. 30, 2010; the entire contents of which are incorporated herein by reference.

FIELD

Embodiments described herein relate generally to a manufacturing method for a solid-state imaging device.

BACKGROUND

A conventional solid-state imaging device includes a plurality of photodiodes formed on a semiconductor substrate in a grid shape, a plurality of color filter layers on each of these photodiodes and a plurality of microlenses formed on these color filter layers. The photodiode, the color filter layer and the microlense form pixel.

Each color filter layer formed for each pixel is, for example, any of a red color filter layer that allows light of a red wavelength to pass, a green color filter layer that allows light of a green wavelength to pass, and a blue color filter layer that allows light of a blue wavelength to pass. These color filter layers of three colors are formed in such a way that surfaces thereof are in one plane. The color filter layers of three colors are arranged in a Bayer array on the semiconductor substrate.

The color filter layer of each color has a different refractive index of light. However, each microlens is formed to have the same height on the color filter layer of each color whose surface is formed to be in one plane. Therefore, the focal position of light condensed to photodiodes after passing through each microlens and each color filter layer is different for each transmitted wavelength of the each color filter layer. As a result, sensitivity of light is different from pixel to pixel.

To adjust sensitivity of each pixel, the height of the microlens may be adjusted for each pixel. However, when a plurality of microlenses of mutually different heights is formed, it is necessary to repeat the manufacturing process of microlens two or more times. That is, first a plurality of microlenses of the uniform height is formed and then, predetermined microlenses are covered with a microlens material. Accordingly, only the predetermined microlenses become higher than other microlenses.

In contrast to the manufacturing method for microlenses described above, when a plurality of microlenses of the uniform height is formed, all microlenses can be manufactured in one process. Therefore, when a solid-state imaging device having a plurality of microlenses with mutually different heights is manufactured, there is a problem of an increased number of manufacturing processes compared with a case when a solid-state imaging device having a plurality of microlenses with a uniform height is manufactured.

DETAILED DESCRIPTION

A manufacturing method for a solid-state imaging device according to an embodiment of the present invention includes a step of forming a transparent resin layer, a step of arranging a grating mask, a step of exposing the transparent resin layer to light through the grating mask, a step of forming first resin patterns and second resin patterns, and a step of forming first microlenses and second microlenses. The step of forming the transparent resin layer is a step of forming the transparent resin layer above a principal surface of a semiconductor substrate having a plurality of photodiode layers. The step of arranging a grating mask is a step of arranging a grating mask having a first transmission region and a second transmission region so that the both regions are each positioned above the photodiode layers, the second transmission region having a higher transmittance of the light than the first transmission region and being spaced from the first transmission region. The step of forming first resin patterns and second resin patterns is a step of forming first resin patterns having a constant height and second resin patterns having a constant height by developing the transparent resin layer, the second resin patterns having a lower height than the first resin patterns and being spaced from the first resin patterns. The step of forming first microlenses and second microlenses is a step of forming first microlenses being convex upward and second microlenses being convex upward by thermally treating the first resin patterns and the second resin patterns, the second microlenses having a lower height than the first microlenses.

The manufacturing method for a solid-state imaging device according to an embodiment of the present invention will be described in detail below with reference to the drawings.

(First Embodiment)

Figure 1:
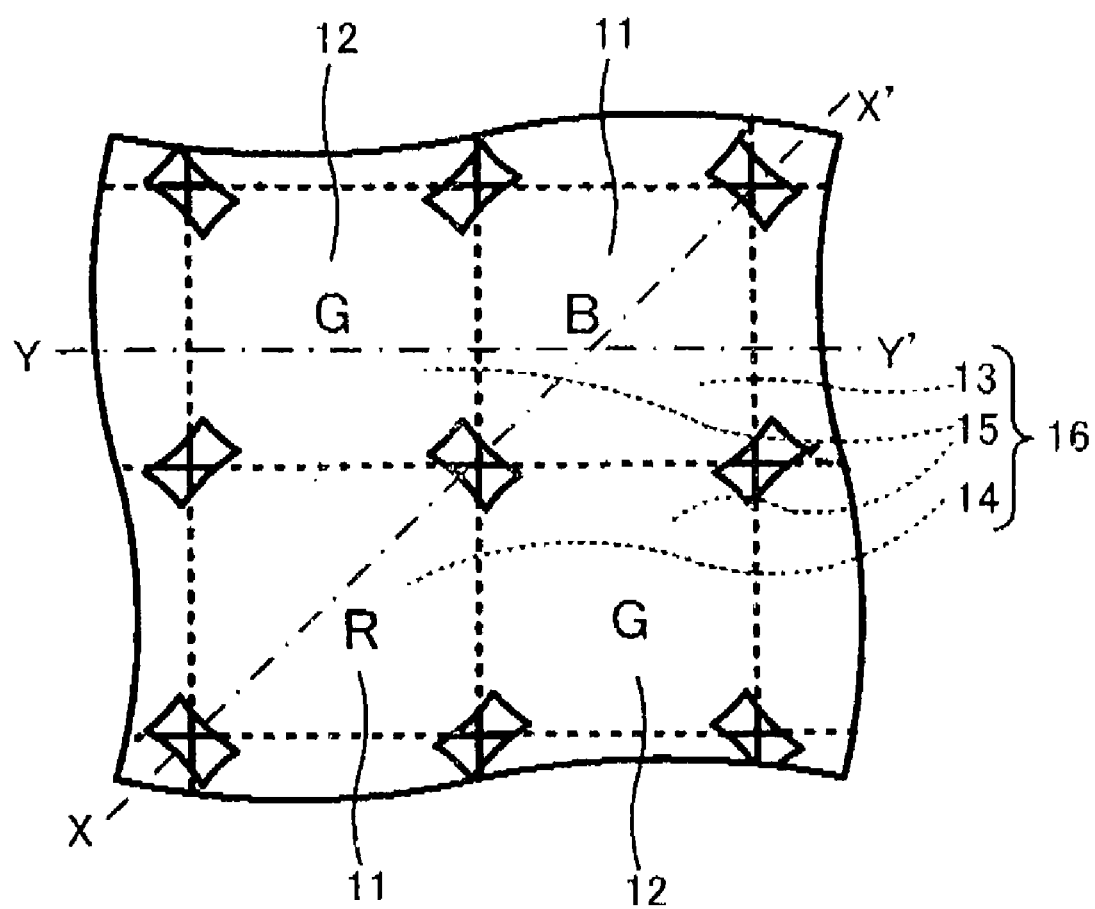
FIG. 1 is a top view showing important sections of a solid-state imaging device manufactured by a manufacturing method for a solid-state imaging device according to a first embodiment.
Figure 2:
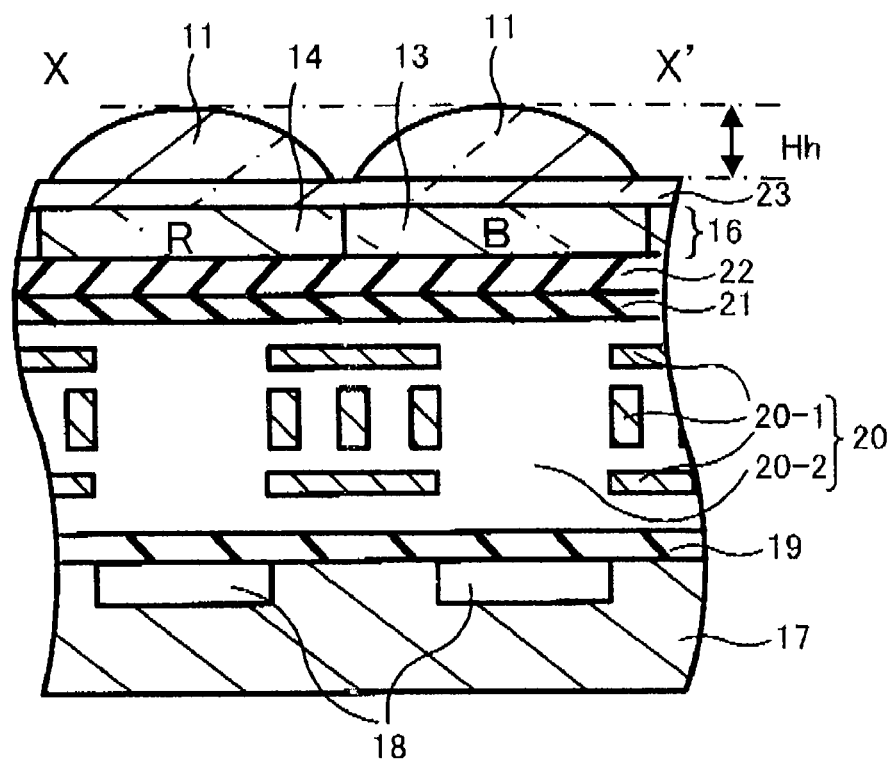
FIG. 2 is a sectional view of important sections of the device along an alternate short and long dashed line X-X' in FIG. 1.
Figure 3:
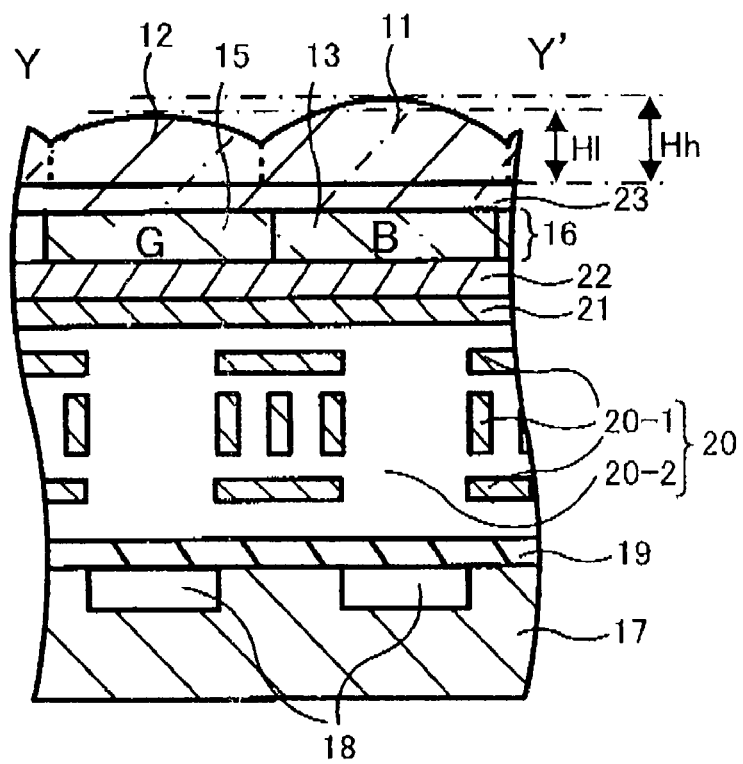
FIG. 3 is a sectional view of important sections of the device along an alternate short and long dashed line Y-Y' in FIG. 1.

FIG. 1 is a top view showing important sections of a solid-state imaging device manufactured by a manufacturing method for a solid-state imaging device according to a first embodiment. FIG. 2 is a sectional view of important sections of the device along an alternate short and long dashed line X-X' in FIG. 1 and FIG. 3 is a sectional view of important sections of the device along an alternate short and long dashed line Y-Y' in FIG. 1. R, G and B shown in each drawing indicate transmitted wavelength bands of the respective color filter layer described later.

The solid-state imaging device shown in FIG. 1 has a plurality of first microlenses 11 and a plurality of second microlenses 12. The plurality of first microlenses 11 and the plurality of second microlenses 12 are formed on a color filter layer 16 (FIGS. 2 and 3) in a grid shape.

The color filter layer 16 (FIGS. 2 and 3) includes a plurality of blue color filter layers 13, a plurality of red color filter layers 14 and a plurality of green color filter layers 15. These color filter layers 13, 14 and 15 of each color are formed on a semiconductor substrate 17 (FIGS. 2 and 3) in a grid shape. The plurality of blue color filter layers 13, the plurality of red color filter layers 14 and the plurality of green color filter layers 15 are arranged, for example, in a Bayer array.

The respective shape of the blue color filter layer 13 and the red color filter layer 14 in a section parallel to a principal surface of the semiconductor substrate 17 (FIGS. 2 and 3) (hereinafter, referred to as a cross section) is rectangular. The plurality of blue color filter layers 13 and the plurality of red color filter layers 14' are arranged in a checkered pattern and corners thereof are mutually in contact.

The shape of the green color filter layer 15 in the cross section is rectangular. The green color filter layer 15 is arranged so as to fill a gap between the blue color filter layer 13 and the red color filter layer 14. The plurality of green color filter layers 15 is arranged in a plurality of gaps between the blue color filter layers 13 and the red color filter layers 14 one by one and corners thereof are mutually in contact.

The first microlens 11 is formed above each of the plurality of blue color filter layers 13 and the plurality of red color filter layers 14. The shape of the first microlens 11 in the cross section is rectangular, but the shape of a corner thereof is circular. The plurality of first microlenses 11 is arranged above the color filter layer 16 (FIGS. 2 and 3) in a checkered pattern.

The plurality of first microlenses 11 is mutually separated. That is, the plurality of first microlenses 11 is mutually separated at corners of the color filter layers 13, 14 and 15 in an oblique direction in the grid arrangement of the color filter layers 13, 14 and 15 of each color (hereinafter, referred to as the oblique direction). Also, the plurality of first microlenses 11 is mutually separated in the vertical and horizontal directions in the grid arrangement of the color filter layers 13, 14 and 15 of each color (hereinafter, referred to as the vertical and horizontal directions).

The second microlens 12 is formed above each of the plurality of green color filter layers 15. The shape of the second microlens 12 in the cross section is rectangular, but the shape of a corner thereof is circular. The plurality of second microlenses 12 is arranged above the color filter layer 16 (FIGS. 2 and 3) in a checkered pattern.

The plurality of second microlenses 12 is each arranged between the plurality of first microlenses 11. The plurality of second microlenses 12 is mutually separated. That is, the plurality of second microlenses 12 is mutually separated at corners of the color filter layers 13, 14 and 15 in the oblique direction. Also, the plurality of second microlenses 12 is mutually separated in the vertical and horizontal directions.

Further, each of the second microlenses 12 is in contact with the plurality of first microlenses 11 adjacent in the vertical and horizontal directions on the green color filter layer 15.

The first microlens 11 and the second microlens 12 are mutually different in size. That is, the area in the cross section (hereinafter, the area in the cross section is simply referred to as the area) of the first microlens 11 is larger than the area in the cross section of the second microlens 12. Further, as will be described later with reference to FIGS. 2 and 3, a height Hh of the first microlens 11 is higher than a height Hl of the second microlens 12.

A portion of the first microlens 11 sticks out onto the green color filter layer 15. However, if the first microlens 11 is formed in such a way that light incident on the first microlens 11 is condensed without passing through the green color filter layer 15, the problem of mixed color can be avoided.

As shown in FIGS. 2 and 3, a solid-state imaging device containing the first and second microlenses 11 and 12 and the color filter layers 13, 19 and 15 of each color is a solid-state imaging device of the so-called front-side illumination type. That is, the solid-state imaging device is a solid-state imaging device having the first and second microlenses 11 and 12 and the color filter layers 13, 14 and 15 of each color formed on the principal surface of the semiconductor substrate 17 made of, for example, silicon. On the principal surface, that is, the front side of the semiconductor substrate 17, a plurality of photodiode layers 18 is arranged and formed in a grid shape.

An oxide film 19 of a uniform thickness is formed on the surface of the semiconductor substrate 17 where the plurality of photodiode layers 18 is formed. A wiring layer 20 is formed on the oxide film 19. The wiring layer 20 is constituted of a plurality of wirings 20-1 formed in multiple layers and an insulating layer 20-2 that insulates these wirings 20-1. A portion of the plurality of wirings 20-1 contains a read gate that transfers charges photoelectric-converted by the photodiode layers 18 to a floating diffusion unit (not shown) for conversion to a voltage.

A passivation film 21 (surface protection film 21) is formed on the surface of the wiring layer 20. A first planarization layer 22 is formed on the surface of the passivation film 21. The surface of the first planarization layer 22 is flat. On the surface of the flat first planarization layer 22, the color filter layer 16 composed of the plurality of blue color filter layers 13, the plurality of red color filter layers 14 and the plurality of green color filter layers 15 is formed. The color filter layers 13, 14 and 15 of each color are formed in such away that the surfaces thereof are in one plane. The color filter layers 13, 14 and 15 of each color are arranged above the photodiode layer 18. Therefore, the color filter layers 13, 14 and 15 of each color are arranged in a grid shape.

A second planarization layer 23 is formed on the surface of the color filter layer 16. The surface of the second planarization layer 23 is flat. On the surface of the flat second planarization layer 23, the plurality of first microlenses 11 and the plurality of second microlenses 12 are formed. The respective shape of the first and second microlenses 11 and 12 in a section perpendicular to the principal surface of the semiconductor substrate 17 (hereinafter, referred to as a longitudinal section) is a lens shape in which the upper side of a rectangle is convexly curved upward. As shown in FIG. 2, each of the plurality of first microlenses 11 has the equal height Hh. As shown in FIG. 3, each of the plurality of second microlenses 12 has the equal height Hl. The height Hl of the second microlens 12 is lower than the height Hh of the first microlens 11.

As shown in FIG. 2, the plurality of first microlenses 11 adjacent to each other is separated from each other in the oblique direction. Similarly, the plurality of second microlenses 12 adjacent to each other is separated from each other in the oblique direction.

As shown in FIG. 3, the first microlens 11 and the second microlens 12 adjacent to each other in the vertical and horizontal directions are in contact with each other on the green color filter 15.

The photodiode layer 18, any one of the blue color filter layer 13, the red color filter layer 14 and the green color filter layer 15, and any one of the first microlens 11 or the second microlens 12 described above form a pixel. The above solid-state imaging device is formed by arranging a plurality of such pixels in a grid shape.

In the solid-state imaging device described above, the first microlens 11 is respectively formed on the blue color filter layer 13 and the red color filter layer 14. The second microlens 12 whose area is smaller than that of the first microlens 11 and whose height is lower than that of the first microlens 11 is formed on the green color filter layer 15. Therefore, compared with a solid-state imaging device in which a plurality of microlenses all having the same height is formed, differences of sensitivity among pixels resulting from differences of refractive indexes of the blue color filter layer 13, the red color filter layer 14 and the green color filter layer 15 can be suppressed in the solid-state imaging device according to the present embodiment.

Figure 4:
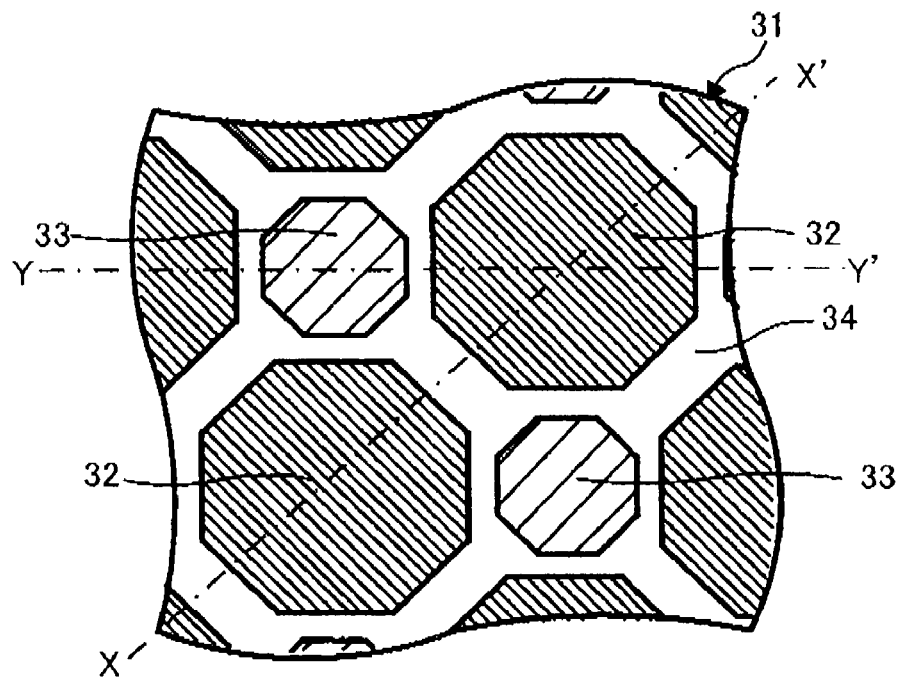
FIG. 4 is a top view showing important sections of a grating mask used for the manufacturing method for a solid-state imaging device in FIG. 1.
Figure 5:
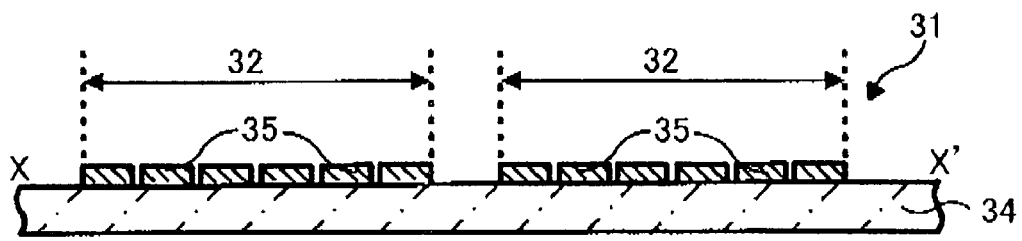
FIG. 5 is a sectional view of important sections of the mask along an alternate short and long dashed line X-X' in FIG. 4.
Figure 6:
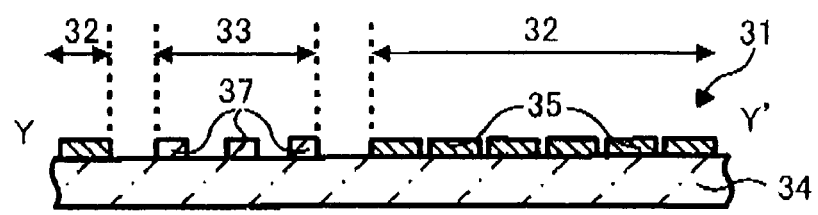
FIG. 6 is a sectional view of important sections of the mask along an alternate short and long dashed line Y-Y' in FIG. 4.

The solid-state imaging device according to the present invention is manufactured by using a grating mask whose transmittance of light is different depending on the position. First, a grating mask 31 applied to the manufacturing method will be described with reference to FIGS. 4 to 6. FIG. 4 is a top view showing important sections of the grating mask 31 applied to the manufacturing method. FIG. 5 is a sectional view of important sections of the device along an alternate short and long dashed line X-X' in FIG. 4 and FIG. 6 is a sectional view of important sections of the device along an alternate short and long dashed line Y-Y' in FIG. 4.

As shown in FIG. 4, the grating mask 31 includes a plurality of first transmission regions 32 and a plurality of second transmission regions 33. The plurality of first transmission regions 32 and the plurality of second transmission regions 33 are arranged in a grid shape. The transmittance of the first transmission region 32 is less than 100%. In the first transmission region 32, transmittance of the light is constant. The transmittance of the second transmission region 33 is less than 100%. In the second transmission region 33, transmittance of the light is constant. The second transmission region 33 is spaced from the first transmission region 32. The transmittance of regions other than the first transmission region 32 and the second transmission region 33 is substantially 100%.

The first transmission region 32 is a region in a substantially octagonal shape. The plurality of first transmission regions 32 is arranged in a checkered pattern and separated from each other.

Similarly, the second transmission region 33 is a region in a substantially octagonal shape. Each of the plurality of second transmission regions 33 is arranged between the plurality of first transmission regions 32 and separated from each other. The second transmission region 33 has an area smaller than that of the first transmission region 32 and a transmittance higher than that of the first transmission region 32.

As shown in FIGS. 5 and 6, with dot patterns composed of microscopic light-shielding chrome films being suitably arranged on the surface of a transparent resin substrate 34 such as glass, the grating mask 31 is capable of arbitrarily control the transmittance of light.

As shown in FIGS. 5 and 6, the first transmission region 32 is a region in which a plurality of first dot patterns 35 is densely arranged. The arrangement density of the first dot patterns 35 is to such an extent that light shone on the first transmission region 32 is hardly transmitted.

As shown in FIG. 6, the second transmission region 33 is a region in which a plurality of second dot patterns 37 whose area is smaller than that of the first dot pattern 35 is arranged more sparsely than the first dot pattern 35. The arrangement density of the plurality of second dot patterns 37 is to such an extent that a portion of light shone on the second transmission region 33 is transmitted. That is, the second transmission region 33 has a higher transmittance than the first transmission region 32.

Incidentally, it is only necessary for the second transmission region 33 to have a higher transmittance than the first transmission region 32. Thus, the second transmission region 33 may be formed by arranging the plurality of second dot patterns 37 having the same area as the first dot pattern 35 in an arrangement density sparser than that of the first dot pattern 35. Alternatively, the second transmission region 33 may be formed by arranging the plurality of second dot patterns 37 having an area smaller than that of the first dot pattern 35 in the same arrangement density as that of the first dot pattern 35.

Figure 7:
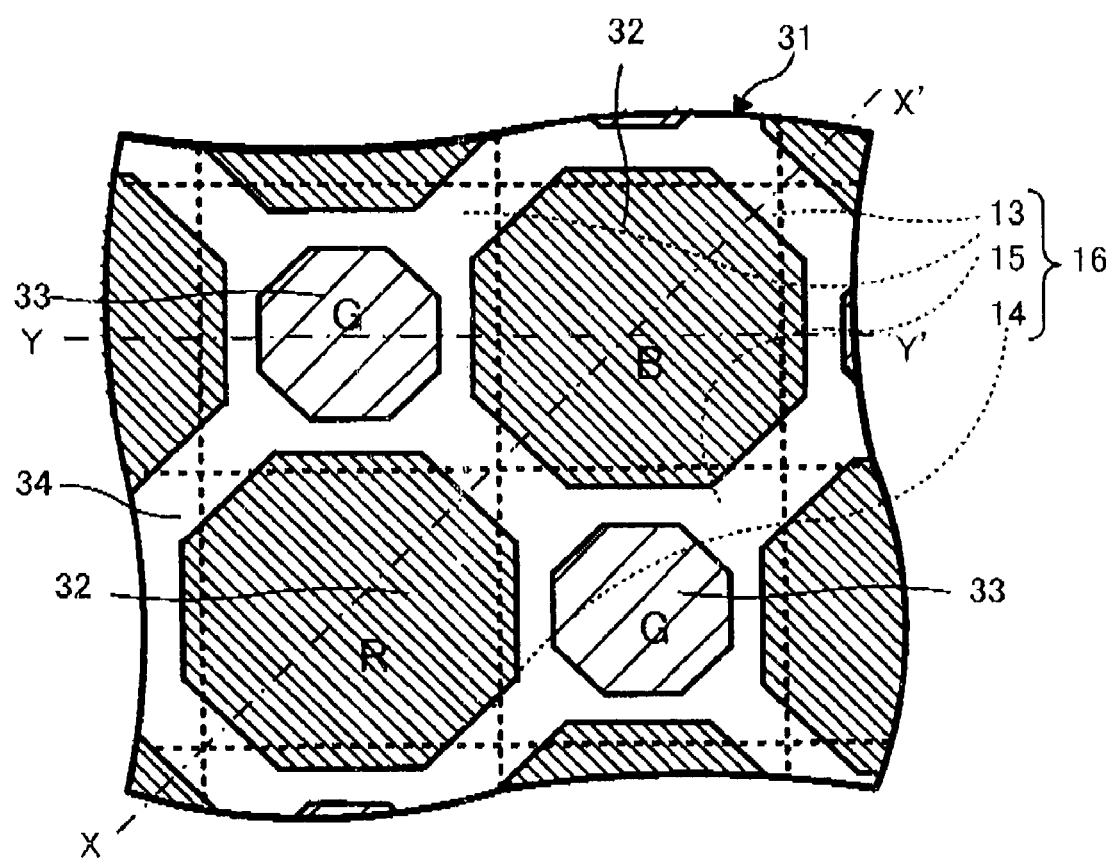
FIG. 7 is a diagram illustrating the manufacturing method for a solid-state imaging device in FIG. 1 and is a top view showing a process in which a resin layer on a color filter layer is exposed to light and corresponding to FIG. 1.
Figure 10:
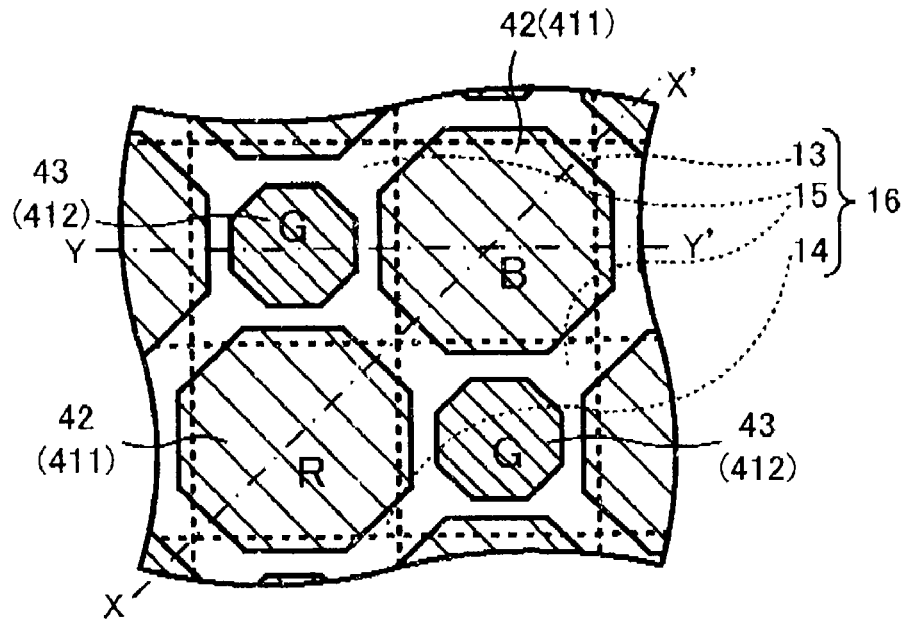
FIG. 10 is a diagram illustrating the manufacturing method for, a solid-state imaging device in FIG. 1 and is a top view showing the process in which the resin layer is developed and corresponding to FIG. 1.
Figure 11:
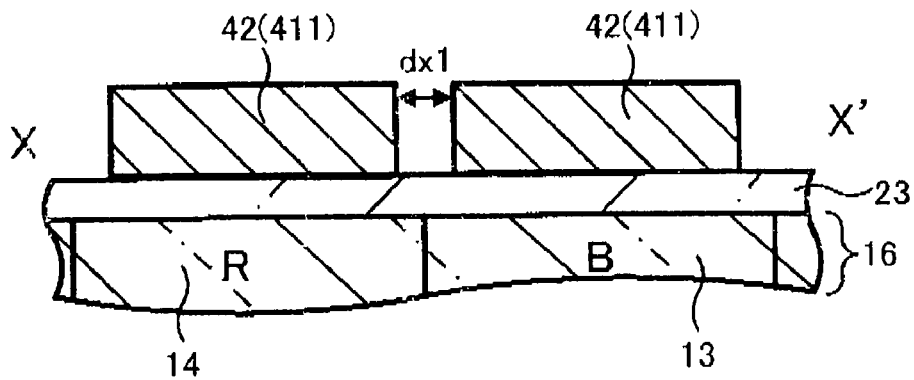
FIG. 11 is a sectional view of important sections of the device along an alternate short and long dashed line X-X' in FIG. 10.
Figure 12:
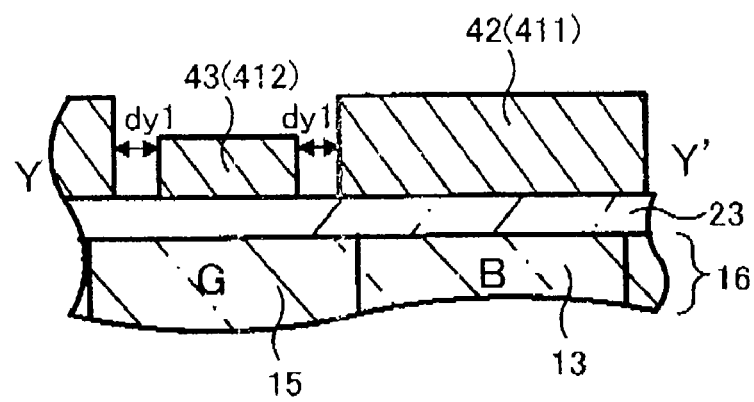
FIG. 12 is a sectional view of important sections of the device along an alternate short and long dashed line Y-Y' in FIG. 10.
Figure 13:
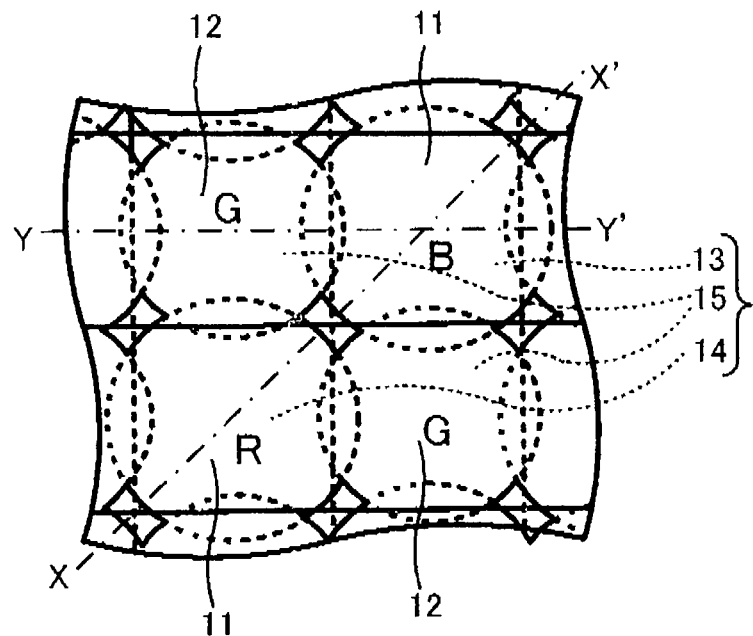
FIG. 13 is a diagram illustrating the manufacturing method for a solid-state imaging device in FIG. 1 and is a top view showing the process in which microlenses are formed and corresponding to FIG. 1.
Figure 14:
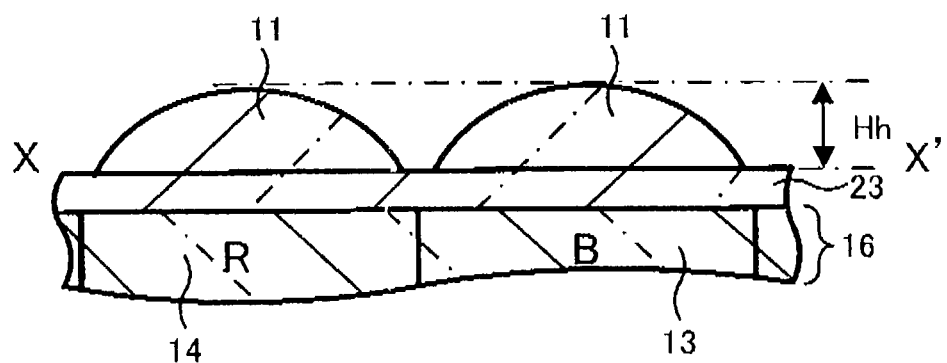
FIG. 14 is a sectional view of important sections of the device along an alternate short and long dashed line X-X' in FIG. 13.
Figure 15:
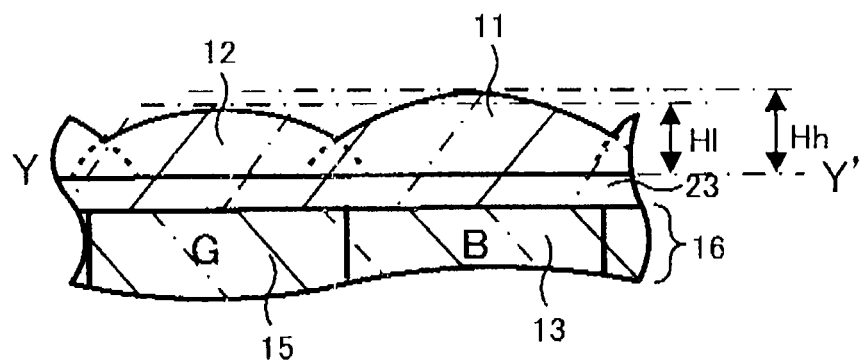
FIG. 15 is a sectional view of important sections of the device along an alternate short and long dashed line Y-Y' in FIG. 13.

Next, the manufacturing method for a solid-state imaging device according to the first embodiment using the grating mask 31 shown in FIGS. 4 to 6 will be described with reference to FIGS. 7 to 15. FIGS. 7, 10 and 13 are respectively top views corresponding to FIG. 1 illustrating the manufacturing method for a solid-state imaging device according to the first embodiment. Further, FIGS. 8, 11 and 14 are sectional views of the device along alternate short and long dashed lines X-X' in FIGS. 7, 10 and 13 respectively and FIGS. 9, 12 and 15 are sectional views of the device along alternate short and long dashed lines Y-Y' in FIGS. 7, 10 and 13 respectively.

First, after the oxide film 19, the wiring layer 20, the passivation film 21, and the first planarization layer 22 being successively formed on the principal surface of the semiconductor substrate 17 on which the plurality of photodiode layers 18 is formed in a grid shape, the color filter layer 16 whose surface is flat is formed on the surface of the first planarization layer 22. A common manufacturing method may suitably be applied as the manufacturing method heretofore and the manufacturing method is not specifically limited.

Figure 8:
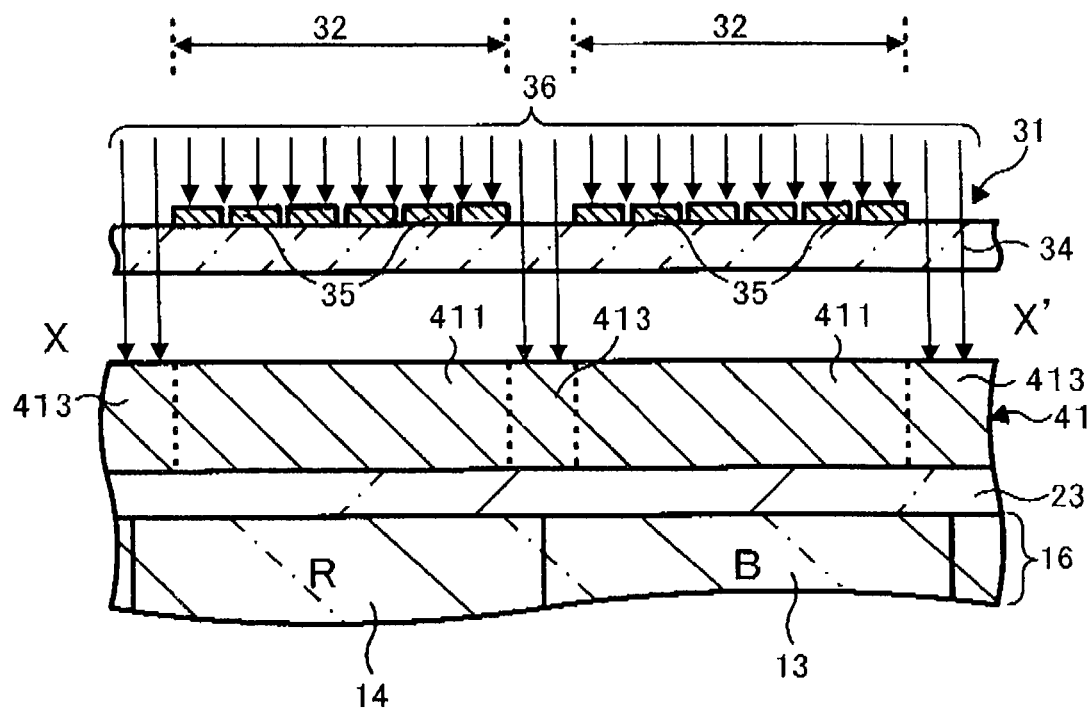
FIG. 8 is a sectional view of important sections of the device along an alternate short and long dashed line X-X' in FIG. 7.
Figure 9:
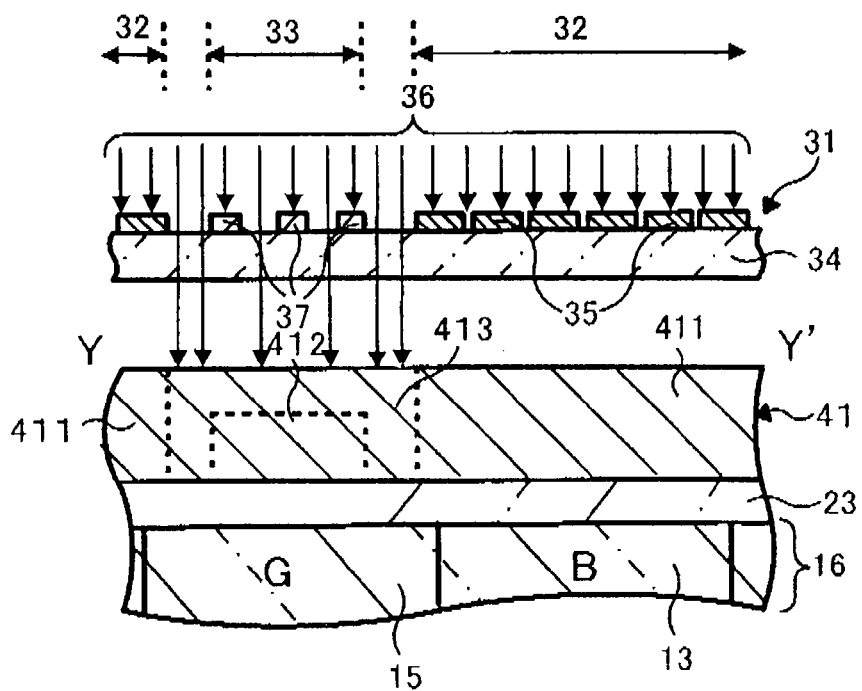
FIG. 9 is a sectional view of important sections of the device along an alternate short and long dashed line Y-Y' in FIG. 7.

Then, as shown in FIGS. 7 to 9, the second planarization layer 23 is formed on the surface of the color filter layer 16 and the transparent resin film 41 having photosensitivity and thermal flowability is formed on the surface of the second planarization layer 23. Then, the grating mask 31 shown in FIGS. 4 to 6 is arranged above the transparent resin film 41 and the transparent resin film 41 is exposed to light via the grating mask 31.

As shown in FIG. 7, the grating mask 31 is arranged by being positioned in such a way that the first transmission region 32 is arranged above the green color filter layer 15 and the second transmission region 33 is arranged above the blue color filter layer 13 or the red color filter layer 14.

The transparent resin film 41 is exposed to light through the grating mask 31 arranged as described above. The first transmission region 32 has constant transmittance and hardly allows exposure light 36 to transmit. Thus, as shown in FIGS. 8 and 9, the transparent resin film 41 immediately below the first transmission region 32 (hereinafter, referred to as a first transparent resin film 411) is hardly exposed to light.

The second transmission region 33 has constant transmittance and is a region having a transmittance higher than that of the first transmission region 32. Thus, as shown in FIG. 9, the transparent resin film 41 immediately below the second transmission region 33 (hereinafter, referred to as a second transparent resin film 412) is irradiated with more of the exposure light 36 than the first transparent resin film 411. Further, the second transmission region 33 is a region having an area smaller than that of the first transmission region 32. Therefore, the range exposed to light via the second transmission region 33 is narrower than the range exposed to light via the first transmission region 32.

The dot patterns 35 and 37 made up of a light-shielding film are not formed between the first transmission region 32 and the second transmission region 33. Thus, almost all of the exposure light 36 is transmitted. Therefore, as shown in FIGS. 8 and 9, the transparent resin film 41 immediately below between the first transmission region 32 and the second transmission region 33 (hereinafter, referred to as a third transparent resin film 413) is irradiated with more of the exposure light 36 than the second transparent resin film 412.

Next, as shown in FIGS. 10 to 12, a plurality of first resin patterns 42 and a plurality of second resin patterns 43 separated from each other are formed on the surface of the second planarization layer 23 by developing the exposed transparent resin film 41. By separating these resin patterns 42 and 43 from each other, the first and second microlenses 11 and 12 in a good lens shape can be formed. The reason therefor will be described later.

The more the exposure light 36 is shone, the more the transparent resin film 41 is removed by the development. As shown in FIGS. 8 and 9, the first transparent resin film 411 is hardly irradiated with the exposure light 36. Thus, almost all the first transparent resin film 411 remains on the surface of the second planarization layer 23. Therefore, as shown in FIGS. 10 to 12, the first resin pattern 42 whose shape in the cross section is a substantially octagonal shape is formed. The first resin pattern 42 has a constant height.

As shown in FIG. 9, the second transparent resin film 412 is irradiated with more of the exposure light 36 than the first transparent resin film 411. Thus, the second transparent resin film 412 is removed more by the development than the first transparent resin film 411. However, a portion of the second transparent resin layer 412 remains on the surface of the second planarization layer 23. Therefore, as shown in FIGS. 10 and 12, the second resin pattern 43 whose shape in the cross section is a smaller substantially octagonal shape than the first resin pattern 42 and lower than the first resin pattern 42 is formed. The second resin pattern 43 has a constant height and is spaced from the first resin pattern 42.

As shown in FIG. 9, the third transparent resin film 413 is irradiated with still more of the exposure light 36 than the second transparent resin film 412. Thus, the third transparent resin film 413 is removed more by the development than the second transparent resin film 412 and is completely removed from the surface of the second planarization layer 23.

The first resin pattern 42 and the second resin pattern 43 have areas and heights determined by considering the state when these patterns 42 and 43 are softened by thermal treatment in the next process.

The first resin pattern 42 has an area and height so that the softened pattern 42 and the other softened first resin pattern 42 adjacent to the pattern 42 in the oblique direction do not come into contact with each other. As shown in FIG. 11, the first resin pattern 42 before softening and the other first resin pattern 42 before softening adjacent to the pattern 42 in the oblique direction are separated by a spacing dx1 so that these patterns should not come into contact when softened.

Similarly, the second resin pattern 43 has an area and height so that the softened pattern 43 and the other softened second resin pattern 43 adjacent to the pattern 43 in the oblique direction do not come into contact with each other.

Further, the first resin pattern 42 and the plurality of second resin patterns 43 adjacent to the pattern 42 in the vertical and horizontal directions have areas and heights so that the softened patterns 42 and 43 are in contact with each other. As shown in FIG. 12, the first resin pattern 42 before softening and the plurality of second resin patterns 43 before softening adjacent to the pattern 42 in the oblique direction are separated by a spacing dy1 so that these patterns 42 and 43 should come into contact with each other when softened.

Incidentally, the shape of the first resin pattern 42 and the second resin pattern 43 in the cross section need not necessarily be octagonal and may have a shape in which the desired first microlens 11 and second microlens 12 are formed. However, the shape of the upper part of the first microlens 11 and the upper part of the second microlens 12 in the cross section is circular. Therefore, the shape of the first resin pattern 42 and the second resin pattern 43 in the cross section is preferably a shape close to a circle such as an octangle or a regular polygon having more side than the octangle.

The first resin pattern 42 and the second resin pattern 43 described above can be formed by adjusting the transmittances and areas of the first transmission region 32 and the second transmission region 33 of the grating mask 31.

Next, as shown in FIGS. 13 to 15, the first resin pattern 42 and the second resin pattern 43 are thermally treated. The first resin pattern 42 and the second resin pattern 43 are softened by the thermal treatment. Surface tension acts on the softened first resin pattern 42 and second resin pattern 43 so as to be deformed into a hemispherical shape. Therefore, the first microlens 11 and the second microlens 12 in a desired lens shape are formed.

The plurality of first resin patterns 42 has, as described above, the desired area and height respectively. Thus, the plurality of first microlenses 11 is separated from each other in the oblique direction and the horizontal and vertical directions.

Similarly, the plurality of second resin patterns 43 has, as described above, the desired area and height. Thus, the plurality of second microlenses 12 is separated from each other in the oblique direction and the horizontal and vertical directions.

Further, the plurality of second resin patterns 43 has an area smaller than that of the plurality of first resin pattern 42 and a height lower than that of the first resin pattern 42. Thus, each of the second microlenses 12 is in contact with the plurality of first microlenses 11 adjacent in the horizontal and vertical directions above the green color filter 15 and has a height lower than that of the first microlens 11.

The solid-state imaging device shown in FIGS. 1 to 3 is manufactured by undergoing the above process.

According to the above manufacturing method for a solid-state imaging device according to the first embodiment, the resin patterns 42 and 43 having mutually different heights are formed at a time by using the grating mask 31 having the regions 32 and 33 with mutually different transmittances. Then, the microlenses 11 and 12 having mutually different heights are formed at a time by thermally treating the resin patterns 42 and 43 having mutually different heights. Therefore, compared with the manufacturing method for a solid-state imaging device having microlenses all with a uniform height, the manufacturing method for a solid-state imaging device according to the first embodiment does not increase the number of manufacturing processes.

Compared with a conventional manufacturing method for a solid-state imaging device that forms the microlenses 11 and 12 having mutually different heights in separate processes, the manufacturing method for a solid-state imaging device according to the first embodiment can reduce the number of manufacturing processes.

According to the manufacturing method for a solid-state imaging device according to the first embodiment, the first resin pattern 42 and the second resin pattern 43 are formed in such a way that the patterns 92 and 43 are separated from each other. When the first resin pattern 42 and the second resin pattern 43 formed in such a way that the patterns 42 and 43 are separated from each other are softened by thermal treatment, as described above, surface tension acts on the softened resin patterns 42 and 43 so as to be deformed into a hemispherical shape. Therefore, the first microlens 11 and the second microlens 12 in a good lens shape can be formed.

If, in contrast to the manufacturing method for a solid-state imaging device according to the present embodiment, the first resin pattern 42 and the second resin pattern 43 are formed in such a way that the patterns 42 and 43 come into contact with each other, it becomes difficult to form the first microlens 11 and the second microlens 12 in a good lens shape. The reason therefor will be described below.

If the first resin pattern 42 and the second resin pattern 43 that come into contact with each other before being softened are softened, surface tension acts on a contact portion thereof in such a way that these patterns 42 and 43 are integrated. Surface tension also acts on each of the first resin pattern 42 and the second resin pattern 43 so as to be deformed into a hemispherical shape. However, the first resin pattern 42 and the second resin pattern 43 are already in contact before being softened so that the contact area when softened is large. Thus, the surface tension acting on the contact portion is larger than the surface tension acting to deform the first resin pattern 42 and the second resin pattern 43 into a hemispherical shape. Therefore, the softened first resin pattern 42 and second resin pattern 43 are integrated and the height of the softened first resin pattern 42 and second resin pattern 43 becomes substantially uniform. As a result, each of the softened first resin pattern 42 and second resin pattern 43 is not formed in a lens shape.

Incidentally, if the manufacturing method for a solid-state imaging device according to the first embodiment is applied, the omission of a process to thermally treat resin patterns can be considered. That is, the transmittance of the above first and second transmission regions 32 and 33 may be adjusted so as to increase the transmittance from the center to an outer circumference of these regions. If a transparent resin layer is exposed to light by using a grating mask whose transmittance changes in each region and developed, a resin pattern formed after the development has a lens shape. Therefore, the process of thermal treatment to form resin patterns into a lens shape can be considered to be omissible.

However, even if a transmission region is formed in such a way that the transmittance increases from the center to the outer circumference thereof, the transmittance of an actual transmission region increases stepwise from the center to the outer circumference of the transmission region due to a reason such as an optical diffraction. Thus, stepwise irregularities are formed on the surface of a formed resin pattern in a lens shape in accordance with the transmittance changing stepwise. Thus, even if the transmittance in the first and second transmission regions 32 and 33 is adjusted, it is difficult to form microlenses whose surface is smooth. Therefore, a method that omits the process of thermally treating a resin pattern cannot be adopted.

(Second Embodiment)

Figure 16:
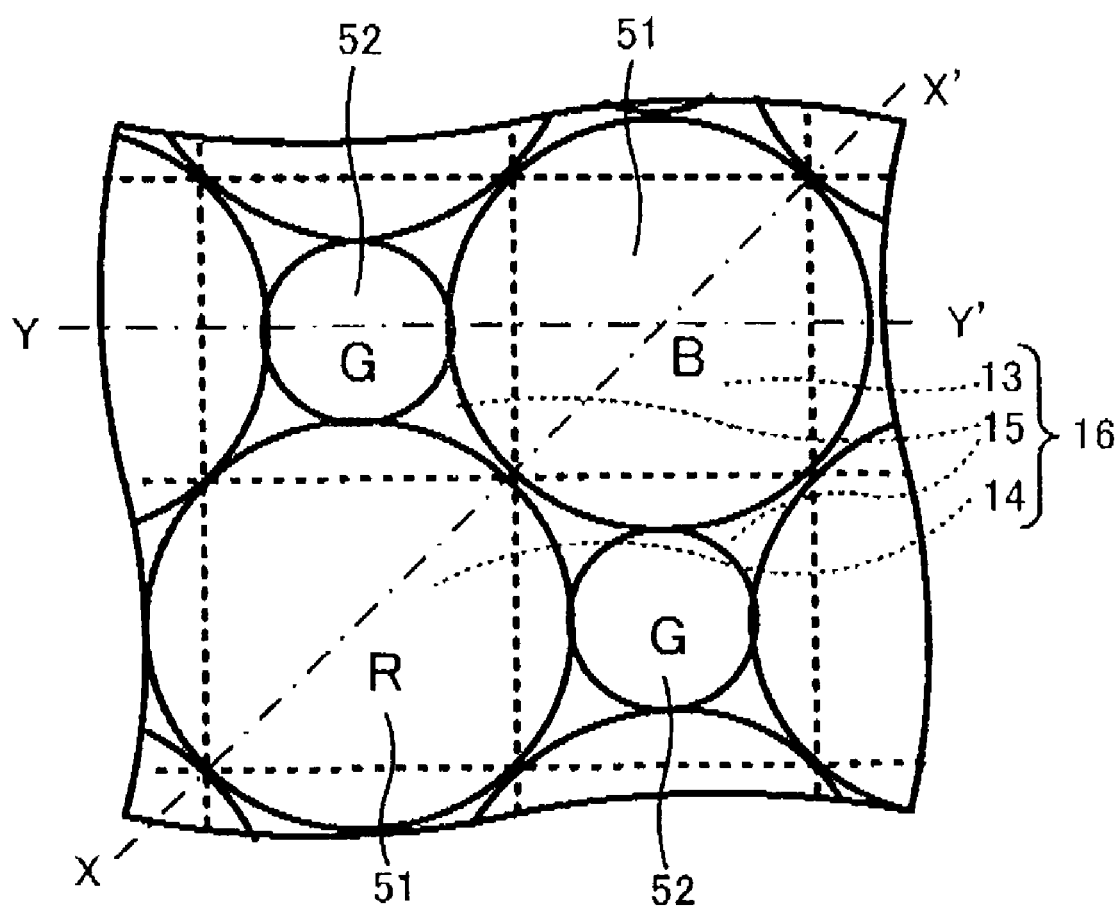
FIG. 16 is a top view showing important sections of the solid-state imaging device manufactured by the manufacturing method for a solid-state imaging device according to a second embodiment.
Figure 17:
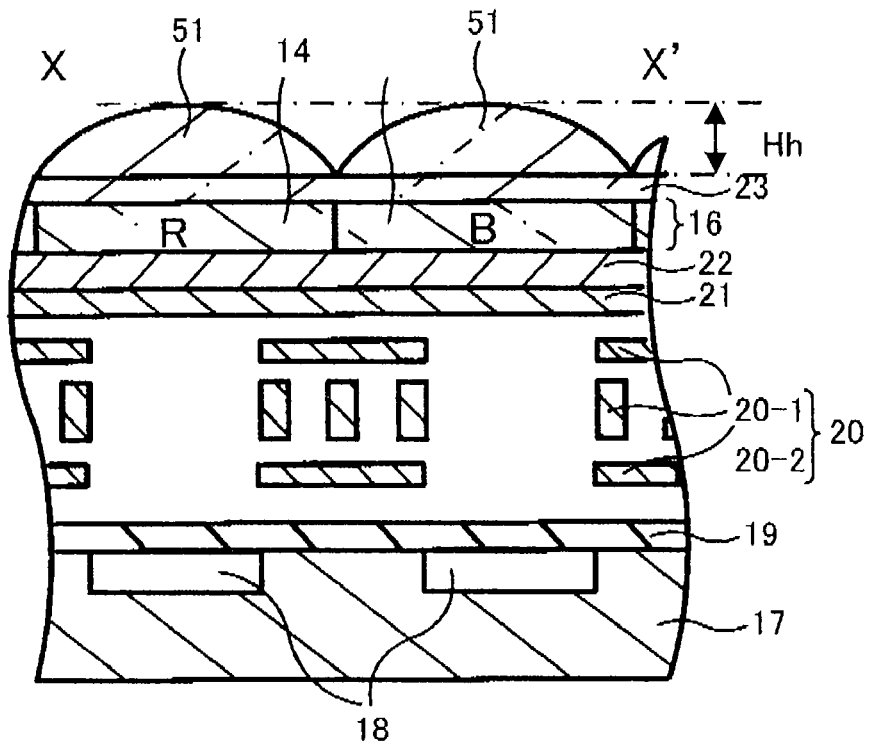
FIG. 17 is a sectional view of important sections of the device along an alternate short and long dashed line X-X' in FIG. 16.
Figure 18:
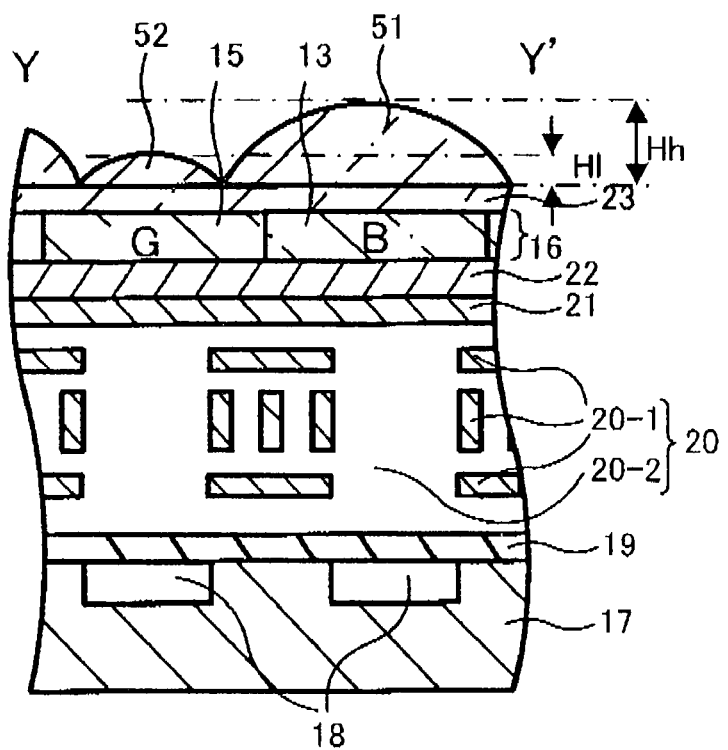
FIG. 18 is a sectional view of important sections of the device along an alternate short and long dashed line Y-Y' in FIG. 16.

FIG. 16 is a top view showing important sections of the solid-state imaging device manufactured by the manufacturing method for a solid-state imaging device according to a second embodiment. FIG. 17 is a sectional view of important sections of the device along an alternate short and long dashed line X-X' in FIG. 16 and FIG. 18 is a sectional view of important sections of the device along an alternate short and long dashed line Y-Y' in FIG. 16. Only different portions of a solid-state imaging device manufactured by the manufacturing method for a solid-state imaging device according to the second embodiment from a solid-state imaging device manufactured by the manufacturing method for a solid-state imaging device according to the first embodiment will be described and the same reference numerals are attached to similar portions and a description thereof is not repeated here.

The solid-state imaging device shown in FIGS. 1 to 3 is different from the solid-state imaging device shown in FIGS. 16 to 18 in that first microlenses 51 and second microlenses 52 have different shapes and sizes.

As shown in FIG. 16, the shape of the first microlens 51 in the cross section is circular. A plurality of first microlenses 51 is arranged above the color filter layer 16 in a checkered pattern.

Circumferences of the plurality of first microlenses 51 are in contact with each other at corners of the color filter layers 13, 14 and 15 in the oblique direction. Circumferences of the plurality of first microlenses 51 are separated from each other in the vertical and horizontal directions.

The shape of the second microlens 52 in the cross section is circular. A plurality of second microlenses 52 is arranged above the color filter layer 16 in a checkered pattern. The plurality of second microlenses 52 is each arranged between the plurality of first microlenses 51.

Circumferences of the plurality of second microlenses 52 are separated from each other in the oblique direction and the vertical and horizontal directions. The circumference of each of the second microlenses 52 is in contact with circumferences of the plurality of first microlenses 51 adjacent in the vertical and horizontal directions.

The first microlens 51 and the second microlens 52 are mutually different in size. That is, the area of the first microlens 51 is larger than that of the second microlens 52. Further, as shown FIGS. 17 and 18, the height Hh of the first microlens 51 is higher than the height H1 of the second microlens 52 shown in FIG. 18.

The shape of the first microlens 51 and the second microlens 52 in the longitudinal section is semicircular.

Figure 19:
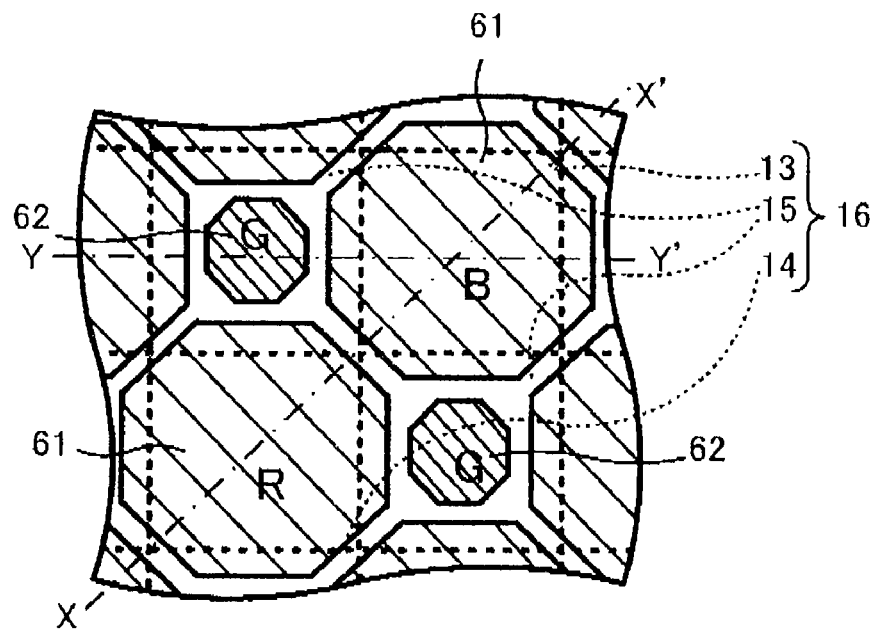
FIG. 19 is a diagram illustrating the manufacturing method for a solid-state imaging device in FIG. 16 and is a top view showing the process in which the resin layer is developed and corresponding to FIG. 1.
Figure 20:
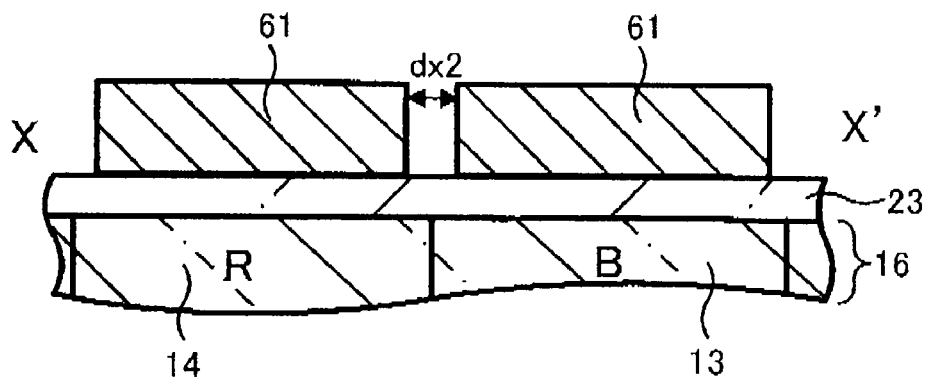
FIG. 20 is a sectional view of important sections of the device along an alternate short and long dashed line X-X' in FIG. 19.

The solid-state imaging device described above can basically be manufactured in the same manner as the manufacturing method for a solid-state imaging device according to the first embodiment. Only different processes from processes of the manufacturing method for a solid-state imaging device according to the first embodiment will be described with reference to FIGS. 19 to 21. FIG. 19 is a top view corresponding to FIG. 16 illustrating the manufacturing method for a solid-state imaging device according to the second embodiment. FIG. 20 is a sectional view of the device along an alternate short and long dashed line X-X' in FIG. 19 and FIG. 21 is a sectional view of the device along an alternate short and long dashed line Y-Y' in FIG. 19.

In the manufacturing method for a solid-state imaging device according to the second embodiment, compared with the manufacturing method for a solid-state imaging device according to the first embodiment, a first resin pattern 61 and a second resin pattern 62 are different in area and height.

Figure 21:
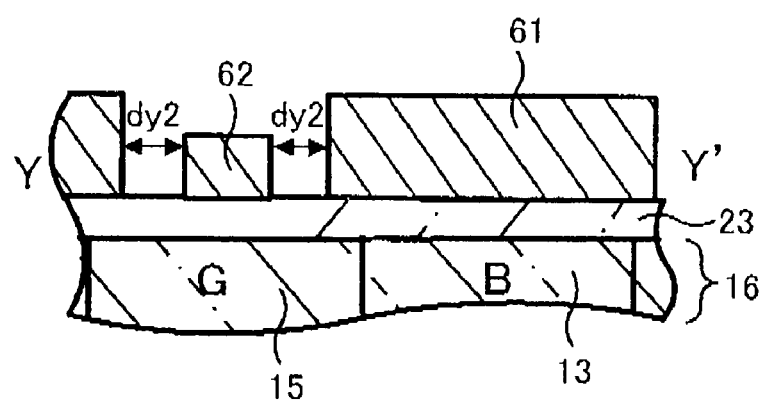
FIG. 21 is a sectional view of important sections of the device along an alternate short and long dashed line Y-Y' in FIG. 19.

That is, the first resin pattern 61 shown in FIGS. 19 to 21 has an area larger than that of the first resin pattern 42 shown in FIGS. 10 to 12 and a height higher than that of the first resin pattern 42.

The second resin pattern 62 shown in FIGS. 19 to 21 has an area smaller than that of the second resin pattern 43 shown in FIGS. 10 to 12 and a height lower than that of the second resin pattern 43.

Areas and heights of the first resin pattern 61 and the second resin pattern 62 are determined by considering the state when these patterns 61 and 62 are softened by thermal treatment in the next process.

The first resin pattern 61 has an area and height so that the circumference of the softened pattern 61 and the circumference of the other softened first resin pattern 61 adjacent to the pattern 61 in the oblique direction come into contact with each other. As shown in FIG. 20, the first resin pattern 61 before softening and the other first resin pattern 61 before softening adjacent to the pattern 61 in the oblique direction are separated by a spacing dx2 so that circumferences of these patterns come into contact when softened. The spacing dx2 is smaller than the spacing dx1 of the first resin pattern 42 shown in FIG. 11.

The second resin pattern 62 has an area and height so that the softened pattern 62 and the other softened second resin pattern 62 adjacent to the pattern 62 in the oblique direction do not come into contact with each other.

Further, the first resin pattern 61 and the plurality of second resin patterns 62 adjacent to the first resin pattern 61 in the vertical and horizontal directions have areas and heights so that circumferences of the softened patterns 61 and 62 are in contact with each other. As shown in FIG. 21, the first resin pattern 61 before softening and the plurality of second resin pattern 62 before softening adjacent to the first resin pattern 61 in the oblique direction are separated by a spacing dy2 so that circumferences of these patterns 61 and 62 should come into contact with each other when softened. The spacing dy2 is larger than the spacing dy1 shown in FIG. 12.

That the above first and second resin patterns 61 and 62 are separated from each other and the second resin pattern 62 is lower than the first resin pattern 61 in height is the same as in the manufacturing method for a solid-state imaging device according to the first embodiment.

The first resin pattern 61 and the second resin pattern 62 described above can be formed by suitably adjusting the transmittances and areas of the first transmission region 32 and the second transmission region 33 of the grating mask 31 shown in FIGS. 4 to 6. That is, the area of the first transmission region 32 may be made larger than that of the first transmission region 32 of the grating mask 31 applied in the first embodiment and the transmittance of the first transmission region 32 may be made lower than that of the first transmission region 32 of the grating mask 31 applied in the first embodiment. Further, the area of the second transmission region 33 may be made smaller than that of the second transmission region 33 of the grating mask 31 applied in the first embodiment and the transmittance of the second transmission region 33 may be made higher than that of the second transmission region 33 of the grating mask 31 applied in the first embodiment.

By thermally treating the first and second resin patterns 61 and 62 after the formation thereof, the solid-state imaging device shown in FIGS. 16 to 18 can be manufactured.

The microlenses 51 and 52 having mutually different heights can be formed at a time also by the manufacturing method for a solid-state imaging device according to the second embodiment described above and thus, compared with the manufacturing method for a solid-state imaging device having microlenses all with a uniform height, the number of manufacturing processes is not increased.

Compared with a conventional manufacturing method for a solid-state imaging device that forms the microlenses 11 and 12 having mutually different heights in separate processes, the manufacturing method for a solid-state imaging device according to the second embodiment can reduce the number of manufacturing processes.

Further, according to the manufacturing method for a solid-state imaging device according to the second embodiment, the first resin pattern 61 and the second resin pattern 62 are formed in such a way that the patterns 61 and 62 are separated from each other and therefore, the first microlens 51 and the second microlens 52 in a good lens shape can be formed.

Incidentally, a solid-state imaging device manufactured by the manufacturing method in the present embodiment has higher sensitivity than a solid-state imaging device manufactured by the manufacturing method for a solid-state imaging device according to the first embodiment. The reason for improved sensitivity will be described below.

In a solid-state imaging device manufactured by the manufacturing method for a solid-state imaging device according to the first embodiment, as shown, for example, in FIG. 3, a portion of the first microlens 11 and a portion of the second microlens 12 are in contact with each other. The first microlens 11 and the second microlens 12 as described above are formed by bringing the first resin pattern 42 and the second resin pattern 43 that are separated from each other before softening into contact after softening. However, if the softened first resin pattern 42 and second resin pattern 43 are brought into contact after softening, surface tension acts on a contact portion so that these patterns 42 and 43 are integrated. Surface tension also acts on the softened first resin pattern 42 and second resin pattern 43 so that each pattern is deformed into a hemispherical shape. For the manufacturing method for a solid-state imaging device according to the first embodiment, the contact area between the first resin pattern 42 and the second resin pattern 43 is small and thus, each of the resin patterns 42 and 43 is formed into a semispherical shape. However, due to the surface tension acting on a boundary portion between the first resin pattern 42 and the second resin pattern 43, the boundary portion is slightly curved convexly downward. Therefore, light incident on the curved portion is scattered.

By contrast, the manufacturing method for a solid-state imaging device according to the second embodiment brings the circumference of the first microlens 51 and that of the second microlens 52 into contact with each other. Thus, the contact area between the softened first resin pattern 61 and the softened second resin pattern 62 is substantially 0. Therefore, surface tension hardly acts on the boundary portion between the first resin pattern 61 and the second resin pattern 62. As a result, the boundary portion is not curved convexly downward and the boundary portion is in a V shape. Thus, light incident on the V-shaped portion is condensed to the photodiode layer 18 without being scattered. Therefore, a solid-state imaging device manufactured by the manufacturing method for a solid-state imaging device according to the second embodiment has higher sensitivity than a solid-state imaging device manufactured by the manufacturing method for a solid-state imaging device according to the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The present invention can be applied when, for example, first microlenses and second microlenses are formed in such a way that a plurality of first microlenses is separated from each other and the circumference of the first microlens and that of the second microlens are in contact with each other. For this purpose, the areas and transmittances of the first transmission region 32 and the second transmission region 33 of the grating mask 31 shown in FIGS. 4 to 6 may be adjusted.

Further, the present invention can be applied when three or more types of microlenses having mutually different heights are formed at a time. For this purpose, a grating mask having three or more transmission regions may be used to suitably adjust the area and transmittance of each of these three or more transmission regions.

Figure 22:
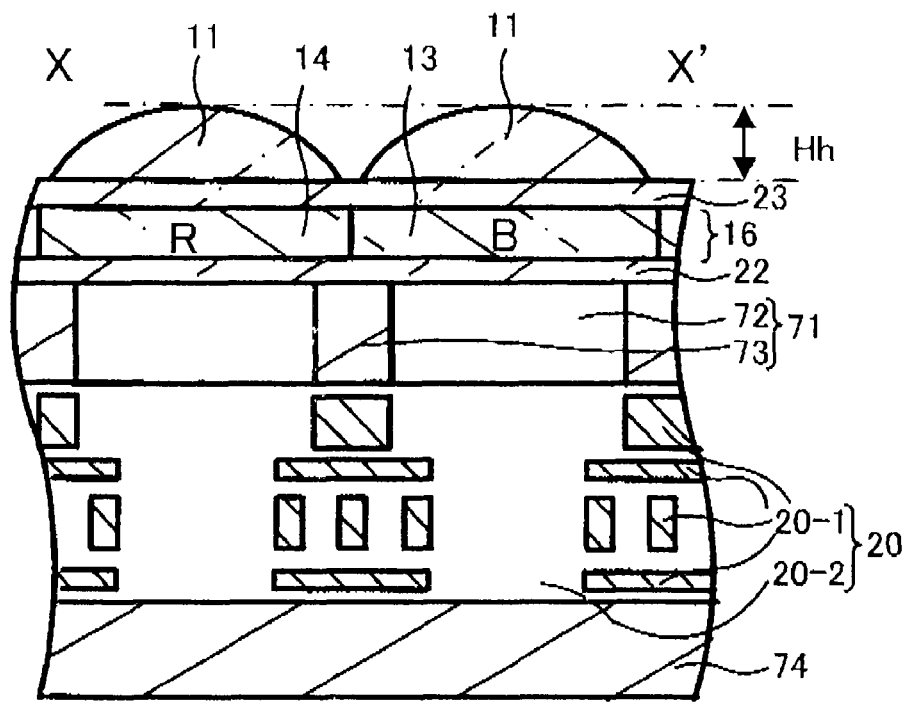
FIG. 22 is a diagram exemplifying the solid-state imaging device applicable to the manufacturing method for a solid-state imaging device according to an embodiment of the present invention and is a sectional view showing important sections of the device corresponding to FIG. 2.
Figure 23:
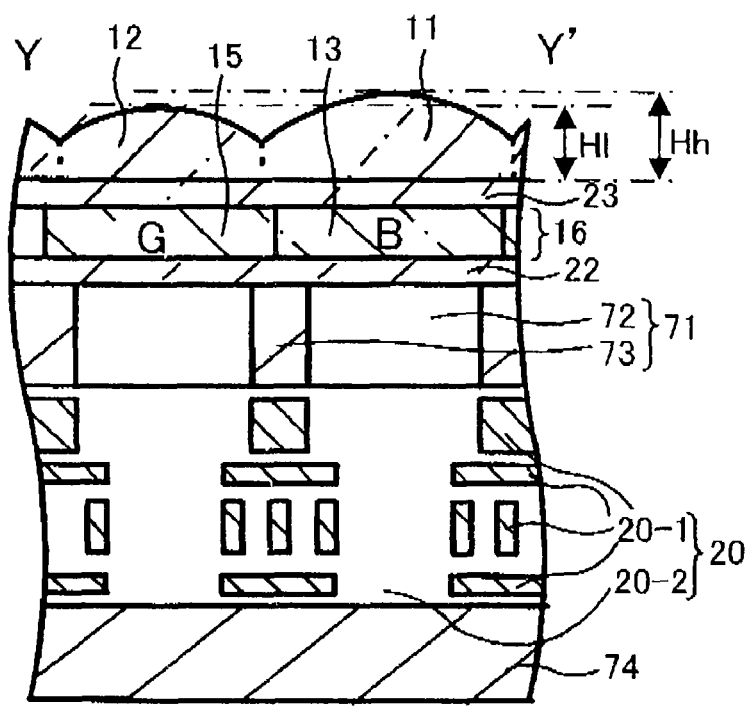
FIG. 23 is a diagram exemplifying the solid-state imaging device applicable to the manufacturing method for a solid-state imaging device according to an embodiment of the present invention and is a sectional view showing important sections of the device corresponding to FIG. 3.

The present invention can also be applied when a solid-state imaging device of the so-called back-side illumination type to which the above first and second microlenses 11, 12, 51 and 52 are applied is manufactured. A solid-state imaging device of the back-side illumination type will be described with reference to FIGS. 22 and 23. FIG. 22 is a sectional view showing important sections of the solid-state imaging device of the back-side illumination type and corresponding to FIG. 2. FIG. 23 is a sectional view showing important sections of the solid-state imaging device of the back-side illumination type and corresponding to FIG. 3. A description of the same portions as those of a solid-state imaging device manufactured by the manufacturing method for a solid-state imaging device according to the first embodiment is not repeated here and the same reference numerals are attached thereto.

As shown in FIGS. 22 and 23, the solid-state imaging device of the back-side illumination type is a solid-state imaging device using the back side of a semiconductor substrate 71 made of, for example, silicon as the principal surface. The color filter layer 16 composed of the blue color filter layer 13, the red color filter layer 14 and the green color filter layer 15, and the first and second microlenses 11 and 12 having mutually different heights are formed on the back side, that is, the principal surface of the semiconductor substrate 71.

On the semiconductor substrate 71, a plurality of photodiode layers 72 is arranged and formed in a grid shape so as to cut through the substrate. A pixel isolation layer 73 is formed between these photodiode layers 72.

The wiring layer 20 is formed on the surface of the semiconductor substrate 71. On the back side of the semiconductor substrate 71, by contrast, the first planarization layer 22, the color filter layer 16 and the second planarization layer 23 are stacked and formed in this order and the first and second microlenses 11 and 12 are formed on the surface of the second planarization layer 23.

A solid-state imaging device in which the wiring layer 20, the color filter layer 16 and the first and second microlenses 11 and 12 in this manner is supported by a supporting substrate 74 formed on the surface (the undersurface of the wiring layer 20 in FIGS. 22 and 23) of the wiring layer 20 and made of, for example, silicon.

In such a solid-state imaging device of the back-side illumination type, light incident via the first and second microlenses 11 and 12 is condensed to the photodiode layer 72 without passing through the wiring layer 20. Thus, compared with a solid-state imaging device of the front-side illumination type, sensitivity can be improved.

The embodiments of a solid-state imaging device manufactured by a manufacturing method for a solid-state imaging device according to the present invention do not limit, for example, the type of color filter layer and the arrangement and ordering thereof. Thus, the first microlenses 11 and 51 are not necessarily be required to be formed on the blue color filter layer 13 and the red color filter layer 14 and the second microlenses 12 and 52 on the green color filter layer 15. Further, a manufacturing method for a solid-state imaging device according to the present invention may be applied when a solid-state imaging device having no color filter layer is manufactured.

What is claimed is:

1. A manufacturing method for a solid-state imaging device, comprising:
    forming a transparent resin layer above a principal surface of a semiconductor substrate having a plurality of photodiode layers;
    arranging a grating mask having a first transmission region and a second transmission region so that the both regions are each positioned above the photodiode layers, the second transmission region having a higher transmittance of the light than the first transmission region and being spaced from the first transmission region;
    exposing the transparent resin layer to light through the grating mask;
    forming first resin patterns having a constant height and second resin patterns having a constant height by developing the transparent resin layer, the second resin patterns having a lower height than the first resin patterns and being spaced from the first resin patterns;
    forming first microlenses being convex upward and second microlenses being convex upward by thermally treating the first resin patterns and the second resin patterns, the second microlenses having a lower height than the first microlenses, and the second microlenses having an area in a section parallel to a surface of the semiconductor substrate smaller than the area of the first microlenses, respectively.

2. The manufacturing method for a solid-state imaging device according to claim 1,
    wherein a respective shape of the first resin pattern and the second resin pattern in a section parallel to a surface of the semiconductor substrate is octagonal.

3. The manufacturing method for a solid-state imaging device according to claim 1,
    wherein the first transmission region and the second transmission region have an octagonal shape.

4. The manufacturing method for a solid-state imaging device according to claim 1,
    wherein the first transmission region and the second transmission region are each regions where a plurality of dot patterns are made up of light-shielding films, and the first transmission region and the second transmission region are regions where the transmittance of light is adjusted by adjusting a density of the plurality of dot patterns or an area in a section parallel to a surface of the semiconductor substrate.

5. The manufacturing method for a solid-state imaging device according to claim 4,
    wherein the plurality of dot patterns formed in the second transmission region is arranged more sparsely than the density of arrangement of the plurality of dot patterns formed in the first transmission region.

6. The manufacturing method for a solid-state imaging device according to claim 4,
    wherein the plurality of dot patterns formed in the second transmission region is smaller than the plurality of dot patterns formed in the first transmission region.

7. The manufacturing method for a solid-state imaging device according to claim 1,
    wherein the plurality of photodiode layers is arranged and formed on the semiconductor substrate in a grid shape,
    the grating mask has the plurality of first transmission regions arranged in a checkered pattern and separated from each other and the plurality of second transmission regions are each arranged between the plurality of first transmission regions and separated from each other in a grid shape separated from each other, and
    the forming the first resin patterns and the second resin patterns includes forming the plurality of first resin patterns arranged in the checkered pattern and separated from each other and the plurality of second resin patterns arranged between and separated from the plurality of first resin patterns and separated from each other by developing the transparent resin layer exposed by using the grating mask having the plurality of first transmission regions and the plurality of second transmission regions.

8. The manufacturing method for a solid-state imaging device according to claim 7,
    wherein the plurality of first resin patterns and the plurality of second resin patterns each have a desired area as an area in a section parallel to the principal surface of the semiconductor substrate and a desired height,
    the desired area and the desired height of the plurality of first resin patterns are an area and a height with which each of the first microlenses formed by thermally treating the plurality of first resin patterns is separated from an other first microlens adjacent to the first microlens,
    the desired area and the desired height of the plurality of second resin patterns are an area and a height with which each of the second microlenses formed by thermally treating the plurality of second resin patterns is separated from an other second microlens adjacent to the second microlens, and
    further, the desired area and the desired height of the plurality of first resin patterns and the plurality of second resin patterns adjacent to each of the plurality of first resin patterns are an area and a height with which the first microlenses and the second microlens formed by thermally treating the plurality of first resin patterns and the plurality of second resin patterns are in contact with each other.

9. The manufacturing method for a solid-state imaging device according to claim 8,
    wherein a shape of the first microlens and the second microlens in a section perpendicular to a surface of the semiconductor substrate is a rectangle whose upper side is upwardly convex.

10. The manufacturing method for a solid-state imaging device according to claim 7,
    wherein the plurality of first resin patterns and the plurality of second resin patterns each have a desired area as an area in a section parallel to the principal surface of the semiconductor substrate and a desired height,
    the desired area and the desired height of the plurality of first resin patterns are an area and a height with which a circumference of each of the first microlenses formed by thermally treating the plurality of first resin patterns is in contact with the circumference of an other first microlens adjacent to the first microlens,
    the desired area and the desired height of the plurality of second resin patterns are an area and a height with which each of the second microlenses formed by thermally treating the plurality of second resin patterns is separated from an other second microlens adjacent to the second microlens, and
    further, the desired area and the desired height of the plurality of first resin patterns and the plurality of second resin patterns adjacent to each of the plurality of first resin patterns are an area and a height with which the circumferences of the first microlenses and the circumferences of the second microlenses formed by thermally treating the plurality of first resin patterns and the plurality of second resin patterns are in contact with each other.

11. The manufacturing method for a solid-state imaging device according to claim 10,
wherein a shape of the first microlens and the second microlens in a section perpendicular to a surface of the semiconductor substrate is semicircular.

12. The manufacturing method for a solid-state imaging device according to claim 1,
wherein the forming the transparent resin layer includes forming a plurality of color filter layers having mutually different transmission wavelengths on the principal surface of the semiconductor substrate corresponding to an arrangement of the photodiode layers and then forming the transparent resin layer above the color filter layers.

13. The manufacturing method for a solid-state imaging device according to claim 12,
wherein the plurality of color filter layers is composed of red color filter layers, blue color filter layers and green color filter layers.

14. The manufacturing method for a solid-state imaging device according to claim 13,
wherein the red color filter layers, the blue color filter layers and the green color filter layers are arranged as a Bayer array.

15. The manufacturing method for a solid-state imaging device according to claim 14,
wherein the first microlenses are formed above the red color filter layers and the blue color filter layers, and
the second microlenses are formed above the green color filter layers.

16. The manufacturing method for a solid-state imaging device according to claim 1,
wherein the transparent resin layer is formed above a front side of the semiconductor substrate.

17. The manufacturing method for a solid-state imaging device according to claim 1,
wherein the transparent resin layer is formed above a back side of the semiconductor substrate.

18. A manufacturing method for a solid-state imaging device, comprising:
forming a transparent resin layer above a principal surface of a semiconductor substrate having a plurality of photodiode layers;
arranging a grating mask having a first transmission region and a second transmission region so that the both regions are each positioned above the photodiode layers, the second transmission region having a higher transmittance of the light than the first transmission region and being spaced from the first transmission region;
exposing the transparent resin layer to light through the grating mask;
forming first resin patterns having a constant height and second resin patterns having a constant height by developing the transparent resin layer, the second resin patterns having a lower height than the first resin patterns, having an area in a section parallel to a surface of the semiconductor substrate smaller than the area of the first resin pattern, respectively, and being spaced from the first resin patterns;
forming first microlenses being convex upward and second microlenses being convex upward by thermally treating the first resin patterns and the second resin patterns, the second microlenses having a lower height than the first microlenses.

19. A manufacturing method for a solid-state imaging device, comprising:
forming a transparent resin layer above a principal surface of a semiconductor substrate having a plurality of photodiode layers;
arranging a grating mask having a first transmission region and a second transmission region so that the both regions are each positioned above the photodiode layers, the second transmission region having a higher transmittance of the light than the first transmission region, having an area smaller than the area of the first transmission region, respectively, and being spaced from the first transmission region;
exposing the transparent resin layer to light through the grating mask;
forming first resin patterns having a constant height and second resin patterns having a constant height by developing the transparent resin layer, the second resin patterns having a lower height than the first resin patterns and being spaced from the first resin patterns;
forming first microlenses being convex upward and second microlenses being convex upward by thermally treating the first resin patterns and the second resin patterns, the second microlenses having a lower height than the first microlenses.

* * * * *